(12) United States Patent
Rodder et al.

(10) Patent No.: US 9,263,549 B2
(45) Date of Patent: Feb. 16, 2016

(54) FIN-FET TRANSISTOR WITH PUNCHTHROUGH BARRIER AND LEAKAGE PROTECTION REGIONS

(71) Applicant: Samsung Electronics Co., Ltd., Gyeonngi-do (KR)

(72) Inventors: Mark S. Rodder, University Park, TX (US); Chris Bowen, Mount Laurel, NJ (US)

(73) Assignee: Samsung Electronics Co., Ltd. (KR)

( * ) Notice: Subject to any disclaimer, the term of this patent is extended or adjusted under 35 U.S.C. 154(b) by 173 days.

(21) Appl. No.: 13/865,478

(22) Filed: Apr. 18, 2013

(65) Prior Publication Data

US 2014/0312393 A1    Oct. 23, 2014

Related U.S. Application Data

(60) Provisional application No. 61/180,390, filed on Apr. 10, 2013.

(51) Int. Cl.
| | |
|---|---|
| *H01L 21/336* | (2006.01) |
| *H01L 29/66* | (2006.01) |
| *H01L 29/78* | (2006.01) |

(52) U.S. Cl.
CPC .... *H01L 29/66537* (2013.01); *H01L 29/66545* (2013.01); *H01L 29/66795* (2013.01); *H01L 29/785* (2013.01)

(58) Field of Classification Search
CPC .............. H01L 29/66795; H01L 21/823814; H01L 21/823821; H01L 27/0605; H01L 29/7848; H01L 29/785; H01L 21/2652; H01L 21/823412; H01L 27/088; H01L 27/0886; H01L 29/7783
See application file for complete search history.

(56) References Cited

U.S. PATENT DOCUMENTS

| | | | |
|---|---|---|---|
| 2009/0081858 A1* | 3/2009 | Qin et al. | 438/527 |
| 2010/0155790 A1* | 6/2010 | Lin et al. | 257/288 |
| 2013/0105914 A1* | 5/2013 | Lin | 257/402 |
| 2014/0035059 A1* | 2/2014 | Giles et al. | 257/369 |

* cited by examiner

*Primary Examiner* — Su C Kim
*Assistant Examiner* — Junaiden Mirsalahuddin
(74) *Attorney, Agent, or Firm* — Myers Bigel Sibley & Sajovec, P.A.

(57) ABSTRACT

A method of forming a field effect transistor includes forming a punchthrough region having a first conductivity type in a substrate, forming an epitaxial layer having the first conductivity type on the substrate, patterning the epitaxial layer to form a fin that protrudes from the substrate, forming a dummy gate and gate sidewall spacers on the fin defining preliminary source and drain regions of the fin on opposite sides of the dummy gate, removing the preliminary source and drain regions of the fin, implanting second conductivity type dopant atoms into exposed portions of the substrate and the punchthrough region, and forming source and drain regions having the second conductivity type on opposite sides of the dummy gate and the gate sidewall spacers.

19 Claims, 9 Drawing Sheets

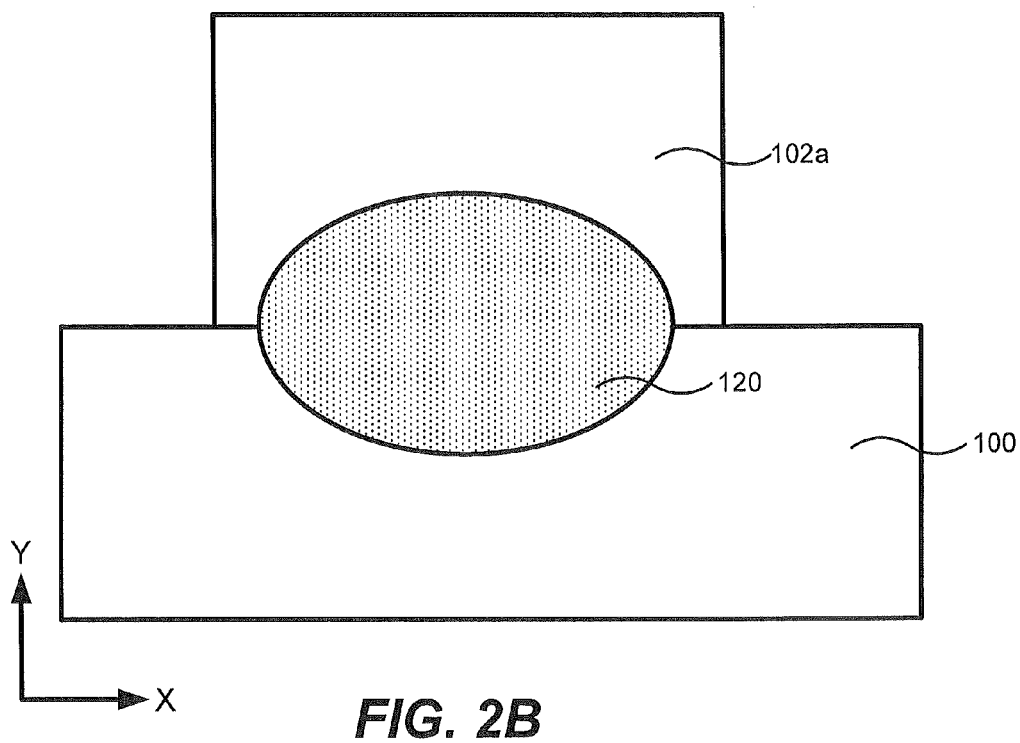
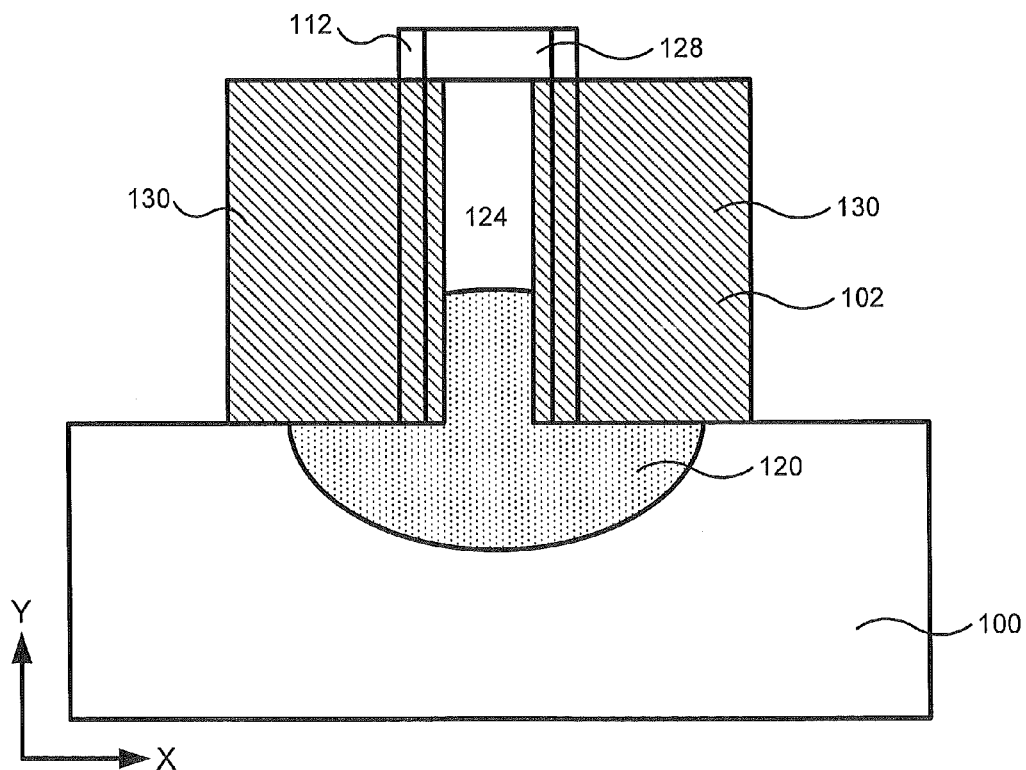

FIN-FET TRANSISTOR WITH PUNCHTHROUGH BARRIER AND LEAKAGE PROTECTION REGIONS

BACKGROUND

1. Field

The present disclosure relates to field effect transistors and methods of manufacturing the same. In particular, the present disclosure relates to fin field effect transistor (FinFET) devices and methods of manufacturing FinFET devices.

2. Description of the Related Art

In order to provide semiconductor devices with greater operational speed and increased integration level, the channel length of MOS field effect transistors (MOSFETs) has been gradually reduced. However, in a planar MOSFET, this may cause a short channel effect that may reduce the channel drive capacity of the device. To control the threshold voltage of a planar MOSFET, it may be desirable to increase the impurity concentration in the channel. However, this may reduce the mobility of carriers in the channel, which may reduce the ON state current of the device. Therefore, in the planar MOSFET, it may be difficult to suppress the short channel effect while maintaining a more rapid operational speed and an increased integration level.

A fin field effect transistor (FinFET) device has a structure that may be capable of reducing the short channel effect. The FinFET device includes an active region having a three-dimensional fin shape that includes source and drain regions on opposite sides of a channel region. The channel region is surrounded by a gate electrode. Thus, a three-dimensional channel may be formed along a surface of the fin. Because the channel is formed on an upper surface and sidewalls of the fin, the FinFET device may have a larger effective channel width in a relatively small horizontal area compared to a conventional planar MOSFET. Thus, a FinFET semiconductor device may have a relatively small size and a more rapid operational speed than a similarly sized conventional planar MOSFET device.

Undesirably, a FinFET device may experience a gate induced drain leakage (GIDL) current that may be higher than that of the planar MOSFET. To decrease the GIDL current, it may be desirable to minimize or reduce the area of overlap between the source/drain regions and the gate electrode. However, a process for forming the source/drain regions may include doping impurities and activating the impurities by a thermal treatment. The thermal treatment may cause horizontal and/or vertical diffusion of the impurities, which may increase the area of overlap between highly doped source/drain regions and the gate electrode. As a result, the GIDL current may not be sufficiently reduced.

SUMMARY

A method of forming a field effect transistor according to some embodiments includes providing a substrate, forming a punchthrough region in the substrate, the punchthrough region having a first conductivity type, forming an epitaxial layer on the substrate, the epitaxial layer having the first conductivity type, patterning the epitaxial layer to form a fin that protrudes from the substrate, forming a dummy gate and gate sidewall spacers on the fin, the dummy gate and gate sidewall spacers defining preliminary source and drain regions of the fin on opposite sides of the dummy gate and gate sidewall spacers, removing the preliminary source and drain regions of the fin to form source/drain recess regions, implanting second conductivity type dopant atoms into exposed portions of the substrate and the punchthrough region, the second conductivity type being opposite the first conductivity type, and forming source and drain regions on opposite sides of the dummy gate and the gate sidewall spacers, the source and drain regions having the second conductivity type.

Implanting the second conductivity type dopants may include implanting the second conductivity type dopants using a substantially zero degree implant to form a leakage protection region near bottoms of the source/drain recess regions and not substantially along sides or near a top of a channel region between the source/drain recess regions.

Forming the punchthrough region may include, before forming the epitaxial layer on the substrate, forming a sacrificial layer on the substrate, implanting first conductivity type dopant atoms into the substrate through the sacrificial layer, and removing the sacrificial layer.

The method may further include implanting interstitial capturing atoms into the substrate to form an interstitial capture region. The interstitial capture region may overlap the punchthrough region. The interstitial capturing atoms may include carbon.

The method may further include annealing the substrate and the sacrificial layer after implanting the first conductivity type dopant atoms.

The method may further include annealing the substrate including the fin after implanting the second conductivity type dopant atoms.

Implanting the first conductivity type dopant atoms may be performed using an implant energy selected to form the punchthrough region to overlap an interface between the substrate and the sacrificial layer.

Forming the source and drain regions may include forming in-situ doped regions by epitaxial regrowth at a temperature less than about 800° C.

Removing the preliminary source and drain regions may include etching the preliminary source and drain regions to cause the fin to have a concave profile with sloped sidewalls at an intersection between the substrate and the fin.

The fin may extend in a first direction and the dummy gate and the gate sidewall spacers may cross the fin in a second direction that is orthogonal to the first direction.

A channel portion of the fin between the source and drain regions may be protected by the dummy gate and the sidewall spacers during implantation of the second conductivity type dopant atoms.

The second conductivity type dopant atoms may form an implanted region having a doping concentration that is less than a doping concentration of the source and drain regions.

A field effect transistor device according to some embodiments includes a substrate, a fin protruding from the substrate and extending in a first direction, the fin including a channel region having a first conductivity type and source and drain regions adjacent the channel region and having a second conductivity type that is opposite the first conductivity type, a punchthrough region in the fin at an intersection between the fin and the substrate and having the first conductivity type, and leakage protection regions between the source and drain regions and the punchthrough regions, the leakage protection regions having the second conductivity type and having a doping concentration that is less than a doping concentration of the source and drain regions.

The leakage protection regions may extend into the fin.

The fin may include a channel region above the punchthrough region, and the punchthrough region has a higher doping concentration than the channel region.

The field effect transistor may further include an interstitial capture region in the substrate. The interstitial capture region may at least partially overlap the punchthrough region.

A method of forming a field effect transistor according to further embodiments includes providing a substrate, forming a sacrificial layer on the substrate, implanting first conductivity type dopant atoms into the substrate through the sacrificial layer to form a punchthrough region in the substrate, removing the sacrificial layer, forming a channel region that protrudes from the substrate, implanting second conductivity type dopant atoms into exposed portions of the substrate and the punchthrough region, the second conductivity type being opposite the first conductivity type, and forming source and drain regions on opposite sides of the dummy gate and the gate sidewall spacers, the source and drain regions having the second conductivity type.

Forming the channel region may include forming an epitaxial layer on the substrate, the epitaxial layer having the first conductivity type, patterning the epitaxial layer to form a preliminary fin that protrudes from the substrate, forming a dummy gate and gate sidewall spacers on the preliminary fin, the dummy gate and gate sidewall spacers defining preliminary source and drain regions of the preliminary fin on opposite sides of the dummy gate and gate sidewall spacers, and removing the preliminary source and drain regions of the preliminary fin.

BRIEF DESCRIPTION OF THE DRAWINGS

The accompanying drawings are included to provide a further understanding of the disclosure and are incorporated in and constitute a part of this application. In the drawings:

FIGS. 2A and 2B are cross sectional views illustrating conventional methods of forming FinFET structures.

DETAILED DESCRIPTION OF EMBODIMENTS

Embodiments of the present inventive concepts now will be described more fully hereinafter with reference to the accompanying drawings. The inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present inventive concepts. As used herein, the term "and/or" includes any and all combinations of one or more of the associated listed items.

Embodiments of the present inventive concepts provide methods for the formation of semiconductor devices and the resulting structures. These embodiments are discussed below in the context of forming FinFET transistors having a single or multiple fins on a bulk silicon substrate.

Figure 1A:
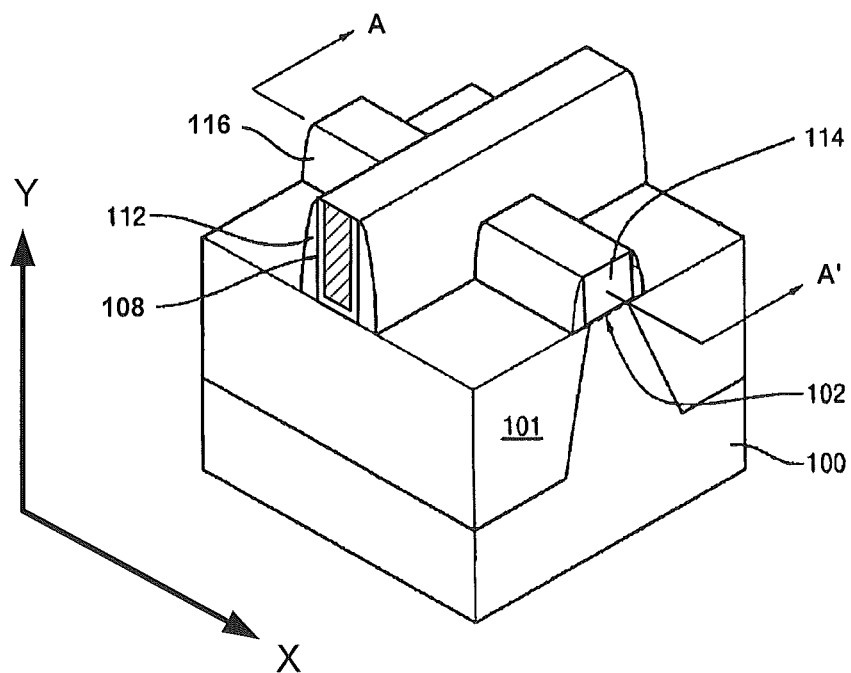
FIG. 1A is an isometric view of a FinFET structure.
Figure 1B:
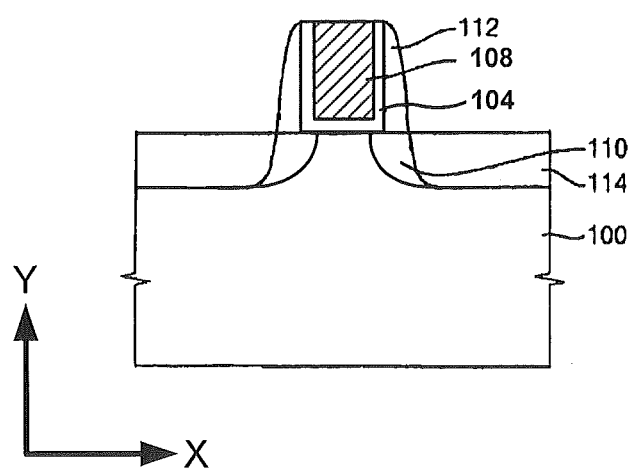
FIG. 1B is a cross section of the FinFET structure taken along line A-A'.

FIG. 1A is a perspective view illustrating a FinFET structure, and FIG. 1B is a cross-sectional view take along a line A-A' in FIG. 1A. Referring to FIGS. 1A and 1B, an active fin 102 may be formed on a semiconductor substrate 100. The semiconductor substrate 100 may include a single crystalline substrate. In particular embodiments, the semiconductor substrate 100 may include a single crystalline silicon substrate. The active fin 102 may have a shape extending in a first direction (X-direction) and protruding above the substrate 100 in a second direction (Y-direction) that is orthogonal to the first direction. In some embodiments, the active fin 102 may include single crystalline silicon.

The fin 102 may be formed, for example, by patterning and etching the substrate 100 using photolithography techniques. Generally, a layer of photoresist material is deposited over the substrate 100. The layer of photoresist material is exposed in accordance with a desired pattern (the fin 102 in this case) and developed to remove a portion of the photoresist material. The remaining photoresist material protects the underlying material from subsequent processing steps, such as etching. It should be noted that other masks, such as an oxide or silicon nitride mask, may also be used in the etching process.

Isolation layer patterns 101 may be arranged on both sides of the active fin 102. The active fin 102 may have an upper surface higher than that of the isolation layer patterns 101. Thus, the active fin 102 may protrude from the upper surface of the isolation layer patterns 101. In some embodiments, the protruded height of the active fin 102 from the isolation layer patterns 101 may be two to ten times the width of the upper surface of the active fin 102, e.g., a width of a fin body in the active fin 102. Alternatively, as shown in the drawings, the protruded height of the active fin 102 from the isolation layer patterns 101 may be substantially the same as the width of the upper surface of the active fin 102.

A gate insulating layer pattern 104 may be formed on surfaces of the active fin 102. In some embodiments, the gate insulating layer pattern 104 may be formed with materials including high k dielectric materials, such as $HfO_2$, $HfSiO_2$, $ZnO$, $ZrO_2$, $Ta_2O_5$, $Al_2O_3$ and the like, and by processes, such as Atomic Layer Deposition (ALD), and the like.

A gate electrode pattern 108 may be formed on the gate insulating layer pattern 104. The gate electrode pattern 108 may intersect the active fin 102 in a third direction that is orthogonal to the first and second directions.

The gate electrode pattern 108 may include a material suitable for a gate electrode of an n-type transistor or a p-type transistor. For example, the gate electrode pattern 108 may include a conductive material including titanium, titanium nitride, tantalum and/or tantalum nitride and have a work function of about 4.0 eV to about 5.2 eV. In an example embodiment, the gate electrode pattern may include a conductive material and have a mid-gap work function that may be a middle value of about 4.6 eV. In another example embodiment, the work function the gate electrode pattern 108 may be about 4.0 eV for an n-type transistor and 5.2 eV for a p-type transistor.

Source/drain extension regions 110 may be formed in a surface of the semiconductor substrate 100 under the surface of the active fin 102 on both sides of the gate electrode pattern 108. In some embodiments, the source/drain expansion regions 110 may have an end that partially overlaps both ends of the gate electrode pattern 108.

Spacers 112 may be formed on sidewalls of the gate electrode pattern 108. In some embodiments, the spacers 112 may include silicon nitride. Source/drain regions 114 may be formed in the surface of the semiconductor substrate 100 under the active fin 102 on both sides of the spacers 112. The source/drain regions 114 may have an impurity concentration higher than that of the source/drain expansion regions 110.

Spacers 116, which may also include silicon nitride, may be formed on sidewalls of the fins 102.

Some embodiments of the present inventive concepts provide FinFET devices that have high ON state current (Ion) per foot-print width (measured in μA/μm) but that have low gate induced drain leakage (GIDL) and/or low punch through leakage current (i.e. low OFF state reverse leakage current Ioff, measured in nA/μm). Further, some embodiments of the present inventive concepts provide short gate length FinFET devices formed on a crystalline semiconductor substrate in which the channel fin (through which the ON state current Ion flows) is overlying and in contact with the crystalline semiconductor substrate 100.

One approach to forming a scaled FinFET device at short gate lengths with low Ioff is to form an implanted punch-through region under the fin. This approach is illustrated in FIGS. 2A-2B. As shown therein, a preliminary fin layer 102a is formed on a substrate 100. A punchthrough (PT) region 120 is implanted into the substrate 100 beneath the preliminary fin layer 102a. The PT region 120 may include doping impurities having a conductivity type that has the same conductivity type as the channel region of the device. For example, for an NMOS device which has a p-type channel region, the PT region 120 may include p-type impurities, such as boron. For a PMOS device which has an n-type channel region, the PT region 120 may include n-type impurities, such as arsenic or phosphorus.

The PT region 120 may extend upward into the preliminary fin layer 102a. The implant to form the PT region 120 may be performed before or after patterning of the preliminary fin layer 102a to form the fin 102, and can be a localized implant.

Referring to FIG. 2B, a dummy gate 128 and gate spacers 112 are formed over the fin 102. The fin 102 may be recessed to define a channel region 124, and highly doped source/drain regions 130 may be regrown adjacent the channel region 124.

The PT region 120 may reduce punchthrough leakage in the device. However, because the PT region 120 may extend upwards into the channel region 124, the threshold voltage $V_T$ may be undesirably increased near the bottom of the fin 102. The proximity of the highly doped source/drain regions near the highly doped PT region 120 may result in an undesirably high level of GIDL.

Figure 3A:
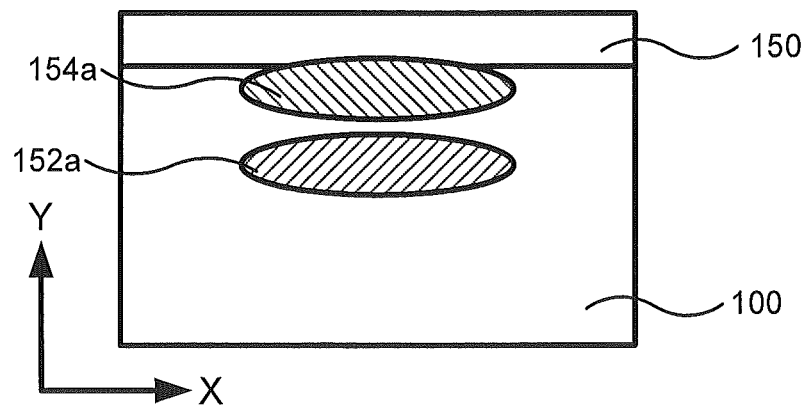
FIGS. 3A to 3G are cross sectional views illustrating methods of forming FinFET structures according to some embodiments.

FinFET devices according to some embodiments are illustrated in FIGS. 3A to 3G, Referring to FIG. 3A, a substrate 100 is provided. The semiconductor substrate 100 may include a single crystalline substrate. In particular embodiments, the semiconductor substrate 100 may include a single crystalline silicon substrate.

A sacrificial layer 150 of, for example, silicon oxide, silicon oxynitride, etc., is formed on the substrate 100. A preliminary punchthrough region 154a is implanted into the substrate 100 through the sacrificial layer 150. The impurity atoms that form the preliminary punchthrough region 154a may be implanted to a depth that is near the surface of the substrate 100. However, some of the impurity atoms may come to rest within the sacrificial layer 150. The preliminary PT region 154a may include doping impurities having a conductivity type that has the same conductivity type as the channel region of the device. For example, for an NMOS device which has a p-type channel region, the PT region 120 may include p-type impurities, such as boron. For a PMOS device which has an n-type channel region, the PT region 120 may include n-type impurities, such as arsenic or phosphorus.

In some embodiments, the preliminary PT region 154a can be co-implanted with other impurities that may act as interstitial capture impurities. For example, the preliminary PT region 154a can be co-implanted with carbon impurities. The interstitial capture impurities may reduce the diffusion of implanted dopant atoms in the semiconductor material, thus reducing the amount of PT implant impurities that can diffuse into the fin during subsequent processing steps.

By performing the PT implant through the sacrificial layer 150, the preliminary PT region 154a may be positioned substantially near the surface of the substrate 100, unlike conventional approaches in which the PT implant is a higher energy implant substantially near the bottom of the region that serves as the channel fin. Moreover, in the present embodiments, the preliminary PT region 154a may be formed prior to deposition of the channel fin material.

In some embodiments, as illustrated in FIG. 3A, a separate preliminary interstitial capture region 152a may be formed in the substrate 100 by ion implantation below the preliminary PT implant region 154a. The preliminary interstitial capture region 152a may be formed by implantation of dopant atoms, such as carbon atoms, that form interstitial capture centers in silicon. The preliminary interstitial capture region 152a may overlap or not overlap the preliminary PT region 154a.

Figure 3B:
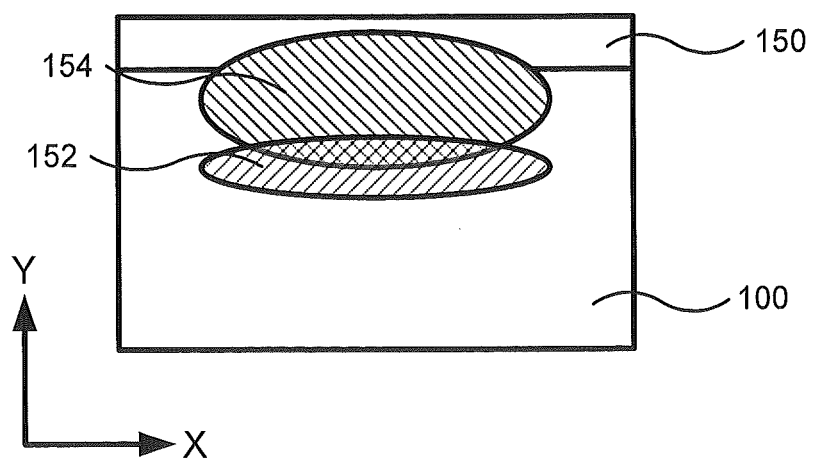

Referring to FIG. 3B, the implant regions 152a, 154a may be subjected to a heat treatment, such as a rapid thermal anneal, which may cause the implanted species to diffuse outward. The preliminary PT region 154a may diffuse substantially into the substrate 100 and/or towards (and slightly into) the sacrificial layer 150 to form a PT region 154. Similarly, the dopant atoms in the preliminary interstitial capture region 152a may diffuse into the substrate to form an interstitial capture region 152. The interstitial capture region 152 may overlap some or all of the PT region 154. The heat treatment may also remove implant damage to form a doped, fully crystalline bulk substrate.

Figure 3C:
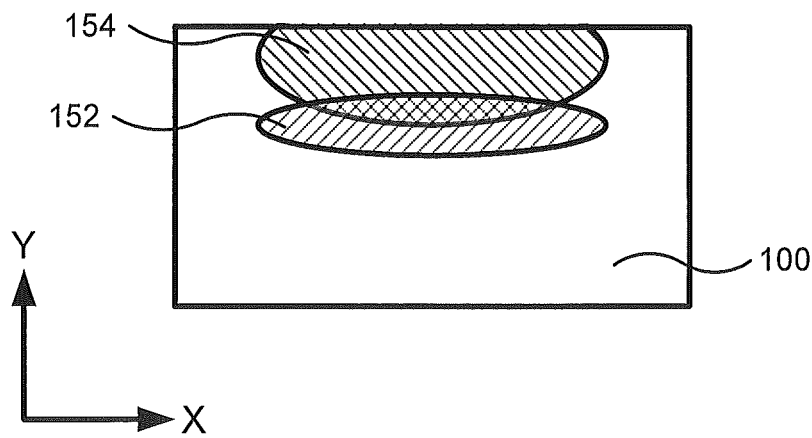

Referring to FIG. 3C, the sacrificial layer 150 is then removed from the substrate 100. The PT region 154 thus has a flat upper surface, and may not extend substantially into an overlying channel fin region, because the channel fin material is not present before formation of the PT region 154.

Figure 3D:
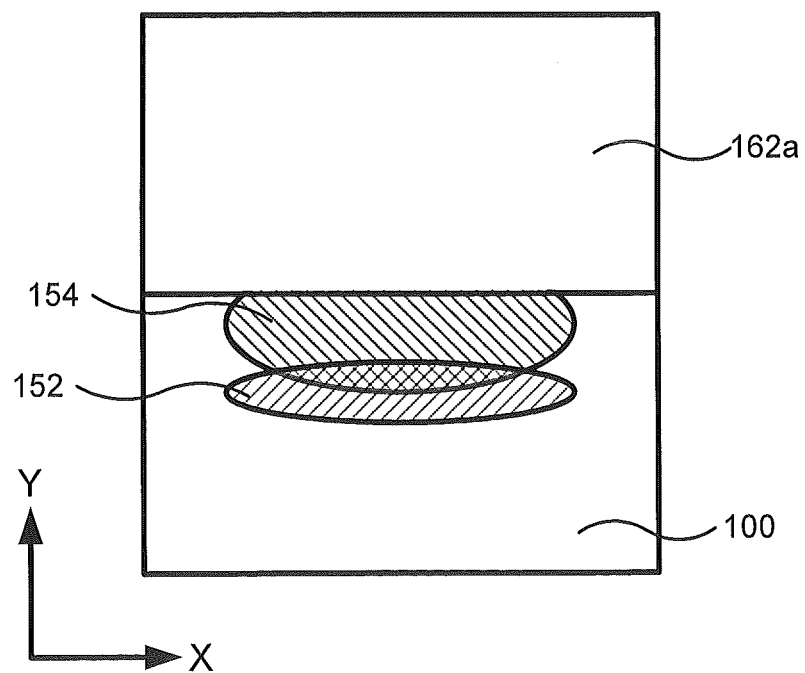

Referring to FIG. 3D, fin material 162a is epitaxially deposited on the substrate 100 at a low temperature (e.g., less than about 800° C.) to reduce or minimize the upward diffusion of the PT region 154 into the overlying channel fin region. Epitaxial regrowth can be performed, for example, using an ultra high vacuum chemical vapor deposition (UH-VCVD) deposition process.

While there can be some upward diffusion of the PT region 154, the upward extent of the PT region 154 of the fin region may be reduced compared to conventional approaches. The fin region 162a is then etched to form the fin 162.

Figure 3E:
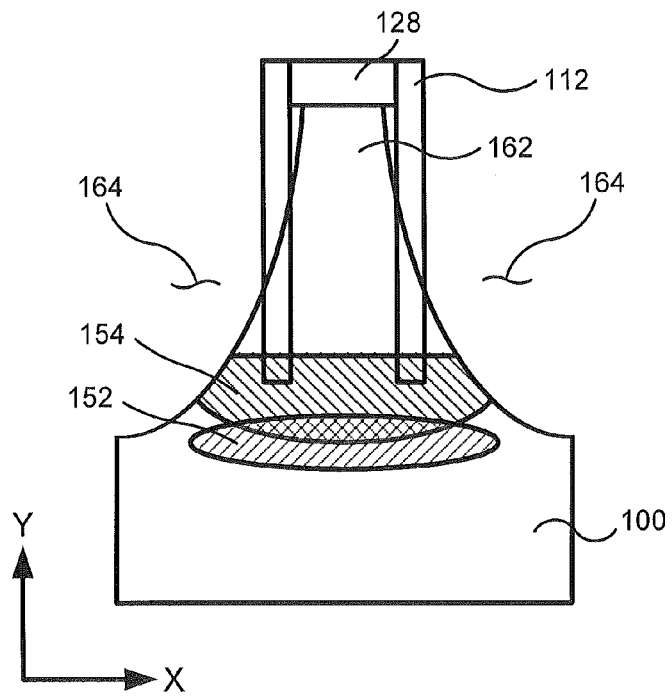

Referring to FIG. 3E, a dummy gate 128 is formed on the fin 162 and sidewall spacers 112 are formed along the dummy gate. The dummy gate may be formed, for example, using undoped polysilicon. The fin 162 is then recessed using an etch process, such as a reactive ion etch process, resulting in source/drain recesses 164 having a rounded (concave) shape. The concave shape of the source/drain recesses 164 may undercut the dummy gate 128, if desired, near the top of the fin 162. According to some embodiments, the rounded recess shape may partially etch through the PT region 154. That is, the recess shape may not be substantially vertical near the interface of the substrate 100 and the fin 162 when the recess partially etches through the PT region 154.

Figure 3F:
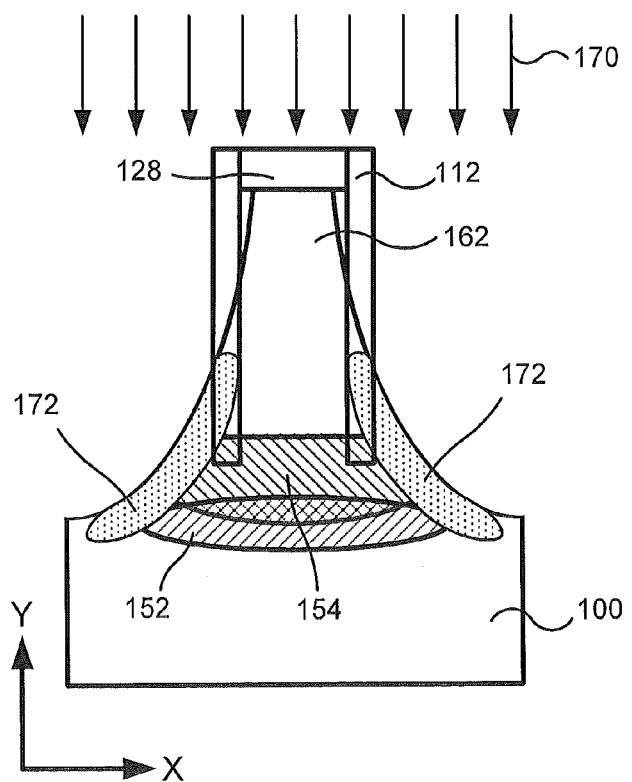

Referring to FIG. 3F, a post-recess implant is performed. In the post-recess implant, dopant atoms 170 having a conductivity type opposite to that of the dopant atoms used in the PT doping process are implanted into the structure to form a leakage protection region 172 adjacent to recess regions 164 and substantially near the interface of the substrate 100 and the fin 162. The post-recess implant is performed substantially into the unprotected portion of the substrate (i.e., the portion not covered by the dummy gate 128 or the spacers 112) near the interface of the substrate 100 and the fin 162, with no implant into the protected top of the fin 162 corresponding to the transistor channel, as the top of the fin 162 is protected from the implants by the dummy gate 128 and the gate spacers 112. The implanted region 172 forms an extension region in the fin 162, which may reduce the parasitic resistance of the device. The implanted region 172 further forms a graded dopant region in the substrate 100. The post-recess implant may be performed using a substantially zero degree implant to form leakage protection regions 172 near bottoms of the source/drain recesses 164 and not substantially along sides or near a top of a channel region between the source/drain recesses 164.

The dopant atoms 170 may be implanted using a low-energy implantation process, e.g., about 1 to 5 keV, at a dose of about $5E12$ $cm^{-2}$ to $5E14$ $cm^{-2}$ to form leakage protection regions 172 having a net doping concentration of about $1E17$ $cm^{-3}$ to $1E19$ $cm^{-3}$.

A heat treatment (anneal) may be performed after the implanted region 172 is formed to remove implant damage.

Due to the combination of the rounded recess shape and post-recess implant, a implanted region 172 having a graded doping profile is formed along all edges of the source/drain region of the device adjacent to the PT doping region 154 without implanting extra dopant atoms into the channel fin region near the top of the fin.

Figure 3G:
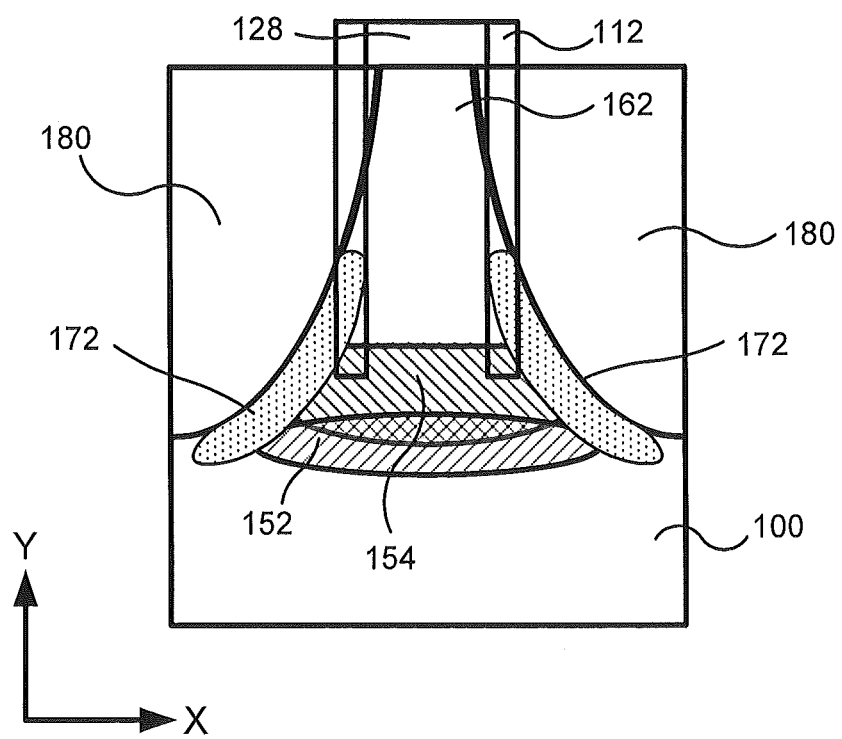

Referring to FIG. 3G, the recess regions 164 are filled in with an epitaxial in-situ highly doped semiconductor material to form source/drain regions 180. The doping concentration of the source/drain regions 180 may be much greater than the doping concentration of the implanted regions 172. For example, the source/drain regions 180 may have a net doping concentration of about $1E20$ $cm^{-3}$.

During the epitaxial S/D refill process, the dopant atoms in the PT region 154 and the dopant atoms in the leakage protection region 172 can diffuse slightly into the fin 162. However, bulk PT leakage may remain low due to the highly doped PT region 154 being formed substantially below the bottom of channel region in the fin 162. The GIDL leakage may also remain low due to the graded lower-doped region 172 below the epitaxial source/drain regions 180. The parasitic resistance of the device may be slightly lowered due to the extension region formed by the leakage protection region 172 connecting the rounded source/drain regions 180 to the channel region of the fin 162.

The remaining process steps for forming a FinFET, including formation of replacement metal gate, trench contacts and salicide of source-drain regions, are conventional and need not be described in detail herein.

Figure 4:
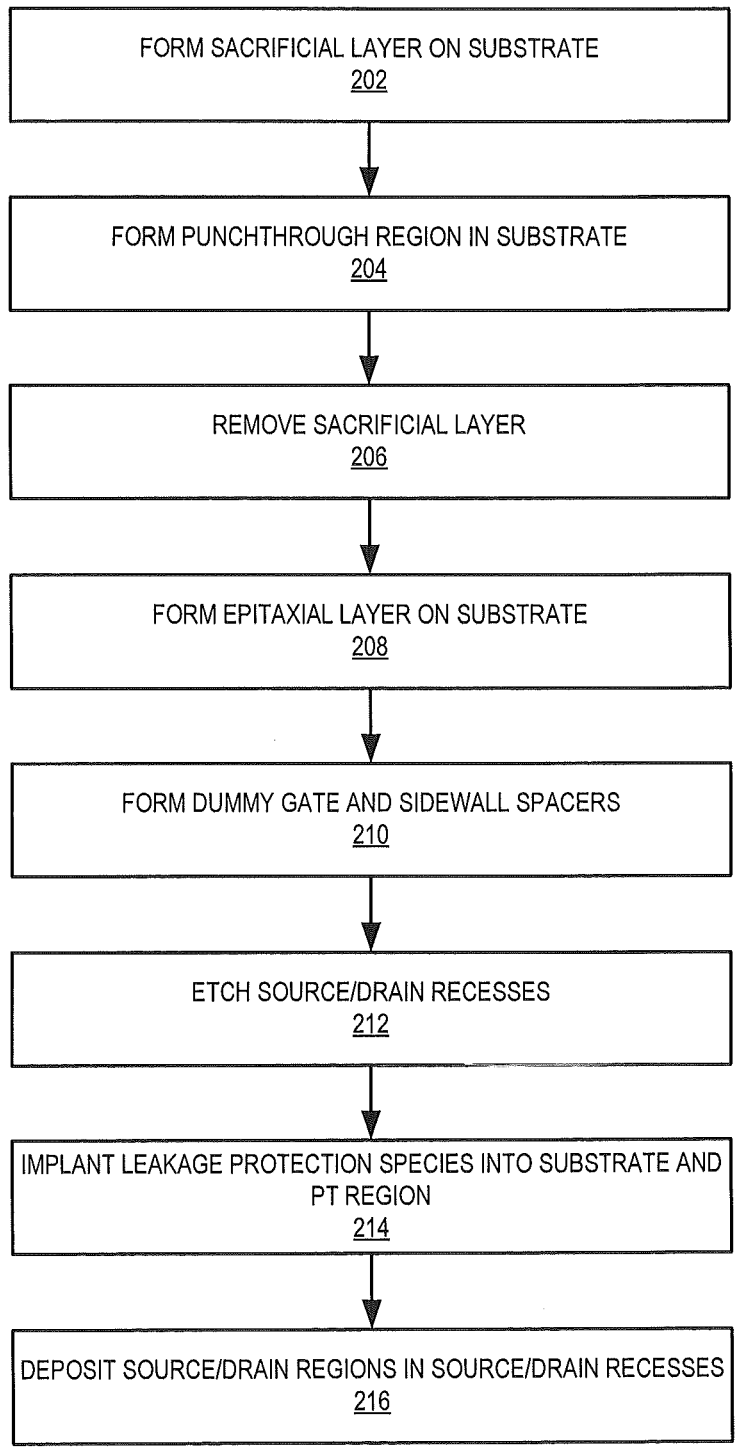
FIG. 4 is a flowchart illustrating operations of forming FinFET structures according to some embodiments.

FIG. 4 is a flowchart illustrating operations of forming FinFET structures according to some embodiments. Referring to FIG. 4 and FIGS. 3A-3G, the operations may include forming a sacrificial layer 150 on a substrate 100 (block 202). The operations next include forming a punchthrough region 154 in the substrate 100 (block 204). In particular, the punchthrough region may be formed by implanting dopant atoms through the sacrificial layer and into the substrate, and annealing the implanted dopant atoms. Interstitial capturing atoms may be co-implanted into the substrate along with the punchthrough dopant atoms.

The sacrificial layer 150 is then removed (block 206), and an epitaxial layer 162a is formed on the substrate including the punchthrough region 154 (block 208).

The epitaxial layer 162a is patterned to form a fin structure that protrudes from the substrate 100, and a dummy gate and sidewall spacers are formed on the fin (block 210). Source/drain recesses are then formed in the fin 162, for example by a reactive ion etching process (block 212).

Next, dopant atoms having opposite conductivity type from the punchthrough implants are implanted into the substrate and the punchthrough region (block 214). Finally, heavily doped source/drain regions are epitaxially regrown in the source/drain recesses (block 216).

As described above, some embodiments include forming rounded recessed source/drain regions followed by a post-recess implant of a species having a conductivity type opposite to the species used for the punchthrough region. The post-recess implant forms a graded region along all sides of the source/drain region adjacent to the PT doping region substantially near the bottom of the fin, which may reduce GIDL leakage. Moreover, the post-recess implant may not affect the fin doping near the top of the fin, since the recess edge is protected by the overlying sidewall spacer material and dummy gate. Thus, GIDL current can be reduced without introducing extra dopant atoms into the top of the channel fin, where a majority of the on-state current (Ion) may flow.

This approach is compatible with any type of channel material. Moreover, it is noted that this combination of rounded recessed source/drain regions with the recess protected at the top of the fin by a sidewall spacer material, and a post-recess implant to form a graded region adjacent to the PT doping region near the bottom of the fin may enable the formation of a highly doped PT region under the fin to suppress bulk punch through leakage, but without resulting in high GIDL leakage. Some embodiments may further enable the fin material to overlie and be in contact with a crystalline substrate to allow strain to be engineered into the channel fin.

According to some embodiments, the PT doping and anneal operations can be performed prior to formation of the channel fin material. Moreover, the specific thickness of the epitaxial deposition of channel fin material, post formation of the PT doping region, can be chosen to enable a channel fin height having reduced up-diffusion of PT doping into the active channel fin.

The present inventive concepts may enable the formation of a scaled bulk FinFET device with low leakage current and high on-current. Some embodiments may be compatible with forming a highly strained channel fin material in direct contact with a crystalline substrate, resulting in low GIDL current and/or low punch through current even when the FinFET device is scaled to a short gate length requiring high PT doping under the channel fin to prevent bulk punch through under the fin.

Some embodiments may further enable the formation of a FinFET device with low leakage current and high on-current which does not require a complicated dielectric isolation integration scheme that may otherwise reduce the channel strain, thus reducing Ion from its maximum expected value associated with maximum channel strain.

Up-diffusion of the PT doping species into the active channel fin may be reduced by forming the PT region (with or without co-implanted species to reduce diffusion) prior to epitaxial deposition of the channel film. Up-diffusion of the PT doping species may be further reduced by tailoring the thickness of the epitaxial deposition of the channel fin material after the PT doping step, thus enabling a lower threshold voltage ($V_T$) along a larger depth of the active channel fin, if desired. It is expected that any high threshold voltage region caused by up-diffusion will not substantially affect threshold voltage variation of the total device, since it is the top of the fin which will conduct the majority of the ON state current, thus reducing any threshold voltage fluctuation that can occur due to higher doping at the bottom of the fin.

In some embodiments, the crystalline substrate may have a crystal lattice constant that is different from the lattice constant of an overlying channel fin material. The difference in lattice constants may result in high channel strain in the overlying channel fin material, which may increase mobility in the channel.

For example, in some embodiments, a Ge condensation process may be performed to form a channel fin with a high germanium content to increase strain in the fin, thereby increasing mobility. A highly doped PT region formed under the fin to suppress bulk punch through leakage but without resulting in high GIDL leakage may further enable the channel fin material to overlie and be in contact with a crystalline substrate to engineer maximum strain in the channel fin.

FIGS. 5A to 5D are cross sectional views illustrating methods of forming FinFET structures according to further embodiments in which a strained channel fin is formed.

Figure 5A:
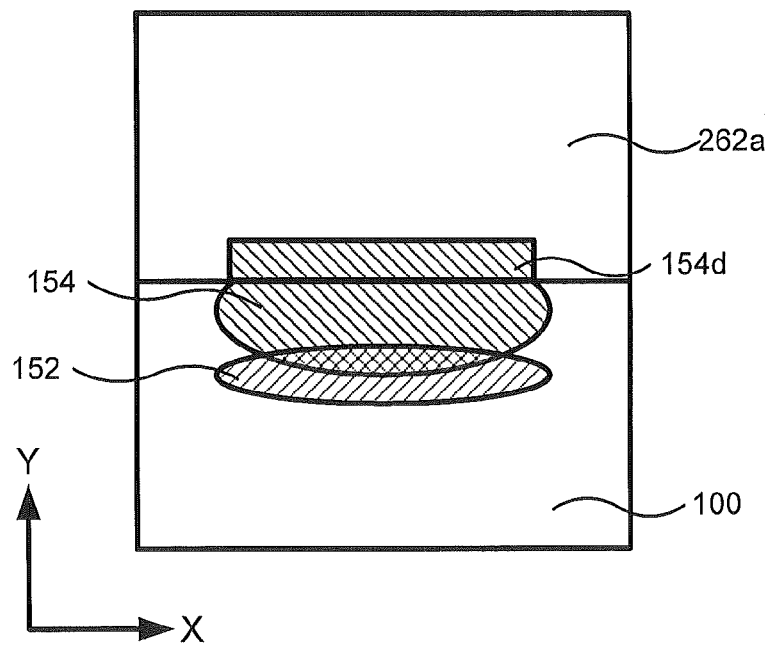
FIGS. 5A to 5D are cross sectional views illustrating methods of forming FinFET structures according to further embodiments.

Referring to FIG. 5A, after formation of the PT region 154 in a substrate 100 and removal of the sacrificial layer 150, (see FIG. 3B), a preliminary fin layer 262a is formed on the substrate 100 by low temperature epitaxial deposition. A Ge condensation process is then performed to increase the percentage of germanium in the preliminary fin layer 262a. The Ge condensation process may be performed as described in U.S. application Ser. No. 13/801,367, filed Mar. 16, 2013, entitled "METHODS OF FABRICATING INTEGRATED CIRCUIT DEVICE WITH FIN TRANSISTORS HAVING DIFFERENT THRESHOLD VOLTAGES," the disclosure of which is incorporated herein by reference. As part of the Ge condensation process, the structure may be subjected to heat treatment at temperatures high enough to cause some diffusion of the dopant atoms in the PT region 154 to diffuse into the preliminary fin layer 262a, forming a diffusion doped region 154d in the preliminary fin layer 262a. The thickness of the preliminary fin layer 262a may be adjusted to account for the diffusion of PT dopant atoms. The preliminary fin layer 262a may be patterned to form a fin 262 on the substrate 100.

Figure 5B:
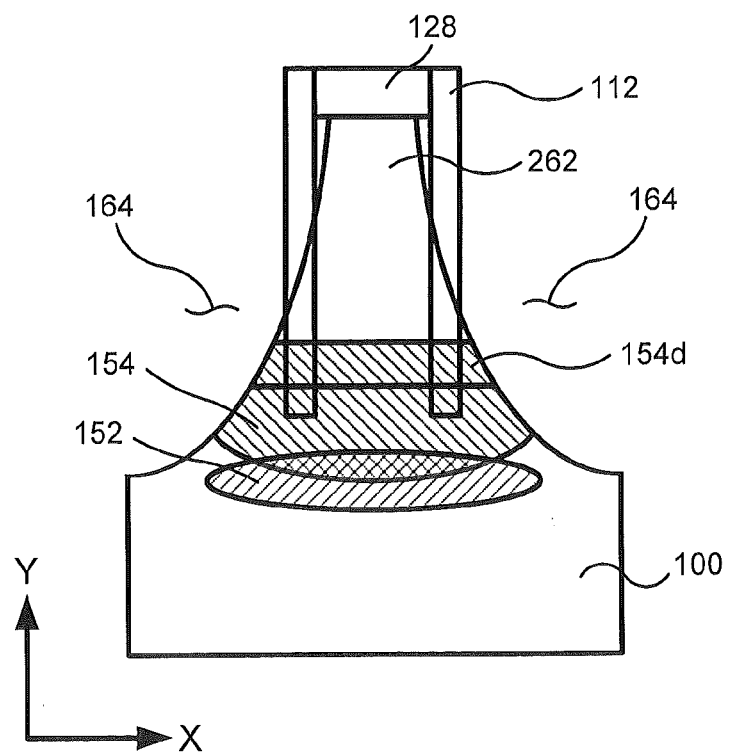

Referring to FIG. 5B, a dummy gate 128 is formed on the fin 262 and sidewall spacers 112 are formed along the dummy gate. The dummy gate may be formed, for example, using undoped polysilicon. The fin 262 is then recessed using an etch process, such as a reactive ion etch process, resulting in source/drain recesses 164 having a rounded (concave) shape. The concave shape of the source/drain recesses 164 may undercut the dummy gate 128, if desired, near the top of the fin 262. According to some embodiments, the rounded recess shape may partially etch through the PT region 154. That is, the recess shape may not being substantially vertical near the interface of the substrate 100 and the fin 262 when the recess partially etches through the PT region 154.

Figure 5C:
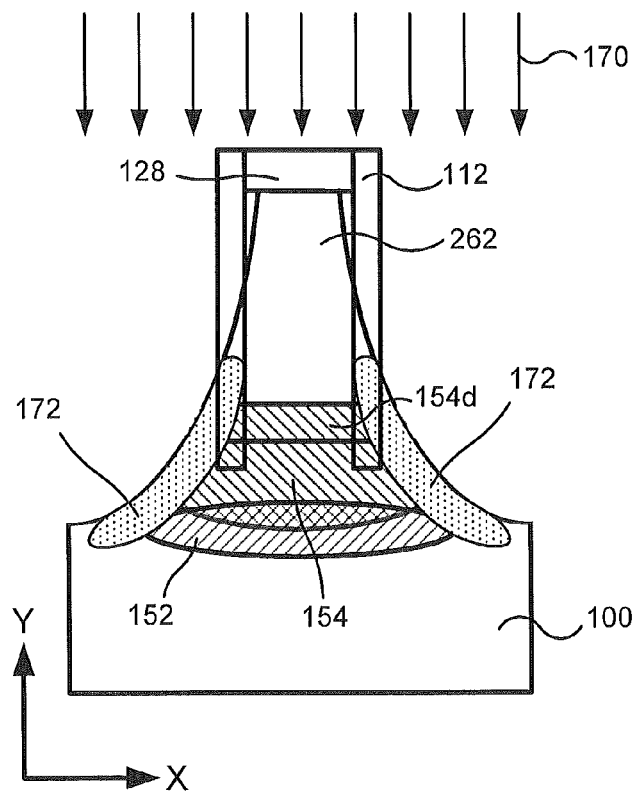

Referring to FIG. 5C, a post-recess implant is performed. In the post-recess implant, dopant atoms 170 having a conductivity type opposite to that of the dopant atoms used in the PT doping process are implanted into the structure to form a leakage protection region 172 adjacent to recess regions 164 and substantially near the interface of the substrate 100 and the fin 262. The post-recess implant is performed substantially into the unprotected portion of the substrate (i.e., the portion not covered by the dummy gate 128 or the spacers 112) near the interface of the substrate 100 and the fin 262, with no implant into the protected top of the fin 262 corresponding to the transistor channel, as the top of the fin 262 is protected from the implants by the dummy gate 128 and the gate spacers 112. The implanted region 172 forms an extension region in the fin 262, which may reduce the parasitic resistance of the device. The implanted region 172 further forms a graded dopant region in the substrate 100.

The dopant atoms 170 may be implanted using a low-energy implantation process, e.g., about 1 to 5 keV, at a dose of about $5E12$ cm$^{-2}$ to $5E14$ cm$^{-2}$ to form leakage protection regions 172 having a net doping concentration of about $1E17$ cm$^{-3}$ to $1E19$ cm$^{-3}$.

A heat treatment (anneal) may be performed after the implanted region 172 is formed to remove implant damage.

Due to the combination of the rounded recess shape and post-recess implant, a implanted region 172 having a graded doping profile is formed along all edges of the source/drain region of the device adjacent to the PT doping region 154 without implanting extra dopant atoms into the channel fin region near the top of the fin.

Figure 5D:
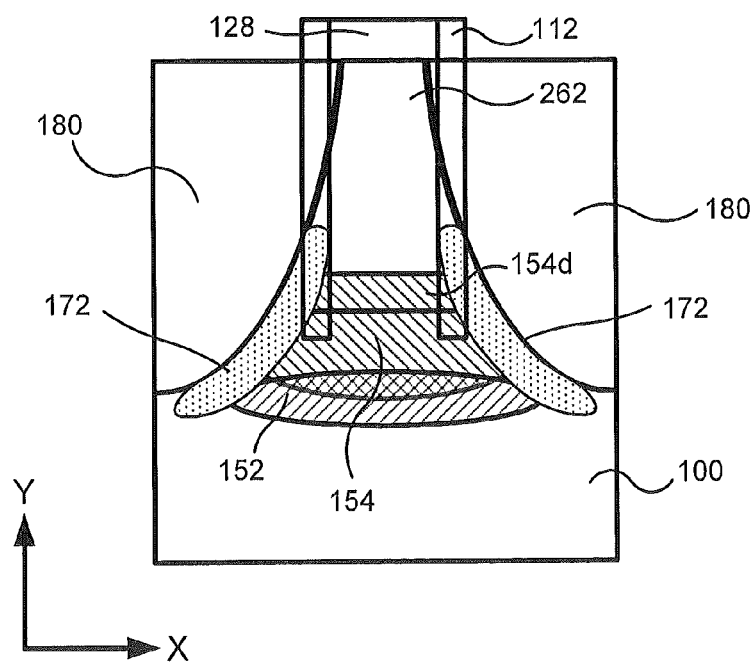

Referring to FIG. 5D, the recess regions 164 are filled in with an epitaxial in-situ highly doped semiconductor material to form source/drain regions 180. The doping concentration of the source/drain regions 180 may be much greater than the doping concentration of the implanted regions 172. For example, the source/drain regions 180 may have a net doping concentration of about $1E20$ cm$^{-3}$.

Accordingly, the structure may have both low GIDL due to the leakage protection regions 172 and high on-state current due to increased mobility in the channel, as well as decreased parasitic resistance.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "between", "below," "above," "upper," "lower," "horizontal," "lateral," "vertical," "beneath," "over," "on," etc., may be used herein to describe a relationship of one element, layer or region to another element, layer or region as illustrated in the figures. It will be understood that these terms are intended to encompass different orientations of the device in addition to the orientation depicted in the figures.

Embodiments are described herein with reference to cross-section illustrations that are schematic illustrations of idealized embodiments (and intermediate structures). The thickness of layers and regions in the drawings may be exaggerated for clarity. Additionally, variations from the shapes of the illustrations as a result, for example, of manufacturing techniques and/or tolerances, are to be expected. Thus, embodiments illustrated herein should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted regions. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concepts.

Some embodiments are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes.

It is to be understood that the functions/acts noted in flowchart blocks may occur out of the order noted in the operational illustrations. For example, two blocks shown in succession may in fact be executed substantially concurrently or the blocks may sometimes be executed in the reverse order, depending upon the functionality/acts involved. Although some of the diagrams include arrows on communication paths to show a primary direction of communication, it is to be understood that communication may occur in the opposite direction to the depicted arrows.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed typical embodiments and, although specific terms are employed, they are used in a generic and descriptive sense only and not for purposes of limitation, the scope of the inventive concepts being set forth in the following claims.

What is claimed is:

1. A method of forming a field effect transistor, comprising:
    forming a punchthrough region in a substrate, the punchthrough region having a first conductivity type;
    forming an epitaxial layer on the substrate, the epitaxial layer having the first conductivity type;
    patterning the epitaxial layer to form a fin that protrudes from the substrate;
    forming a dummy gate and gate sidewall spacers on the fin;
    removing portions of the fin on respective opposite sides of the dummy gate to form source/drain recess regions on the respective opposite sides of the dummy gate, the source/drain recess regions exposing the punchthrough region in the substrate; and
    forming source and drain regions in the respective source/drain recess regions, the source and drain regions having a second conductivity type, the second conductivity type being opposite the first conductivity type.

2. The method of claim 1, wherein forming the punchthrough region comprises, before forming the epitaxial layer on the substrate;
    forming a sacrificial layer on the substrate;
    implanting first conductivity type dopant atoms into the substrate through the sacrificial layer; and
    removing the sacrificial layer.

3. The method of claim 2, further comprising implanting interstitial capturing atoms into the substrate to form an interstitial capture region in the substrate.

4. The method of claim 3, wherein the interstitial capturing atoms comprise carbon.

5. The method of claim 2, further comprising annealing the substrate and the sacrificial layer after implanting the first conductivity type dopant atoms.

6. The method of claim 1, further comprising implanting second conductivity type dopant atoms into portions of the substrate and the punchthrough region that are exposed by the source/drain recess regions.

7. The method of claim 6, further comprising annealing the substrate including the fin after implanting the second conductivity type dopant atoms.

8. The method of claim 6, wherein implanting the second conductivity type dopant atoms comprises implanting the second conductivity type dopant atoms using a substantially zero degree implant to form leakage protection regions near bottoms of the source/drain recess regions and not substantially along vertical sides or near a top of a channel region between the source/drain recess regions.

9. The method of claim 1, wherein forming the source and drain regions comprises forming in-situ doped regions by epitaxial regrowth at a temperature less than about 800° C.

10. The method of claim 1, wherein removing the portions of the fin on the respective opposite sides of the dummy gate comprises etching the portions of the fin to cause the fin to have a concave shape with sloped sidewalls near an intersection between the substrate and the fin.

11. The method of claim 1, further comprising:
    increasing a level of strain in the fin relative to a level of strain in the substrate.

12. The method of claim 11, wherein increasing the level of strain in the fin comprises performing a germanium condensation process on the fin.

13. A method of forming a field effect transistor, comprising:
    forming a sacrificial layer on a substrate;

implanting first conductivity type dopant atoms into the substrate through the sacrificial layer to form a punchthrough region in the substrate;

removing the sacrificial layer;

forming a channel region that protrudes from the substrate, the punchthrough region being exposed on opposite sides of the channel region;

implanting second conductivity type dopant atoms into portions of the substrate and the punchthrough region that are exposed by the channel region to form leakage protection regions on the respective opposite sides of the channel region, the second conductivity type being opposite the first conductivity type; and forming source and drain regions on the respective leakage protection regions that are on the respective opposite sides of the channel region, the source and drain regions having the second conductivity type.

14. The method of claim 13, wherein forming the channel region comprises:

forming an epitaxial layer on the substrate, the epitaxial layer having the first conductivity type;

patterning the epitaxial layer to form a preliminary fin that protrudes from the substrate;

forming a dummy gate and gate sidewall spacers on the preliminary fin; and removing portions of the preliminary fin on respective opposite sides of the dummy gate.

15. The method of claim 14, wherein implanting the second conductivity type dopant atoms into the portions of the substrate and the punchthrough region comprises implanting the second conductivity type dopant atoms into the portions of the substrate and the punchthrough region that are not coveted by the dummy gate and the gate sidewall spacers.

16. The method of claim 14, wherein implanting the second conductivity type dopant atoms into the portions of the substrate and the punchthrough region comprises implanting the second conductivity type dopant atoms using a substantially zero degree implant to form the leakage protection regions near a bottom of the channel region and not substantially along vertical sides or near a top of the channel region.

17. The method of claim 16, wherein a concentration of the second conductivity type dopant atoms in the leakage protection regions is lower than a doping concentration of the source/drain regions.

18. The method of claim 14, wherein removing the sacrificial layer is performed prior to forming the epitaxial layer on the substrate.

19. The method of claim 8, wherein a concentration of the second conductivity type dopant atoms in the leakage protection regions is lower than a doping concentration of the source/drain regions.

* * * * *